United States Patent
Hummel et al.

(10) Patent No.: US 6,941,869 B2
(45) Date of Patent: Sep. 13, 2005

(54) SENSOR FOR MONITORING ELECTRONIC DETONATION CIRCUITS

(75) Inventors: Dirk Hummel, Haltern (DE); Ulrich Steiner, Troisdorf (DE)

(73) Assignee: Orica Explosives Technology PTY LTD, Melbourne (AU)

( * ) Notice: Subject to any disclaimer, the term of this patent is extended or adjusted under 35 U.S.C. 154(b) by 0 days.

(21) Appl. No.: 10/415,940

(22) PCT Filed: Oct. 20, 2001

(86) PCT No.: PCT/EP01/12140

§ 371 (c)(1),
(2), (4) Date: Aug. 29, 2003

(87) PCT Pub. No.: WO02/39050

PCT Pub. Date: May 16, 2002

(65) Prior Publication Data

US 2004/0034463 A1 Feb. 19, 2004

(30) Foreign Application Priority Data

Nov. 9, 2000 (DE) .......................................... 100 55 566
Aug. 14, 2001 (DE) .......................................... 101 39 810

(51) Int. Cl.$^7$ ............................................. F23Q 21/00
(52) U.S. Cl. ................. 102/217; 102/206; 102/200; 315/323; 315/209 T
(58) Field of Search ................................ 102/217, 206, 102/200, 204, 215, 202.8, 200.5, 200.4, 200.6, 200.8; 315/323, 312, 316, 209 CD, 209

(56) References Cited

U.S. PATENT DOCUMENTS

| | | | |
|---|---|---|---|
| 4,047,482 A | 9/1977 | Kervizic et al. ........... 102/19.2 |
| 4,216,413 A * | 8/1980 | Plas ............................ 315/323 |
| 4,387,649 A * | 6/1983 | Weidner et al. ............. 102/215 |
| 4,419,933 A | 12/1983 | Kirby et al. ................. 102/206 |
| 4,899,658 A | 2/1990 | Ochi et al. ................... 102/206 |
| 4,986,183 A | 1/1991 | Jacob et al. ................. 102/200 |
| 5,520,114 A * | 5/1996 | Guimard et al. ............ 102/215 |
| 5,621,184 A * | 4/1997 | Gwynn, III ................. 102/215 |
| 5,725,368 A * | 3/1998 | Arensmeier ................... 431/66 |
| 5,969,260 A | 10/1999 | Belk et al. ..................... 73/773 |

FOREIGN PATENT DOCUMENTS

| EP | 0 362 798 A | 4/1990 |
|---|---|---|
| EP | 0 434 883 A | 7/1991 |

OTHER PUBLICATIONS

Patent Abstracts of Japan, vol. 016, No. 138, (E–1186), Apr. 7, 1992, & JP 04–000218 A (Hitachi Ltd.; Others: 01), Jan. 6, 1992, abstract.

* cited by examiner

*Primary Examiner*—Tuyet Thi Vo
(74) *Attorney, Agent, or Firm*—Birch, Stewart, Kolasch & Birch, LLP

(57) ABSTRACT

A voltage sensor (10) for monitoring electronic ignition circuits (1) which contains a plurality of igniters (4) connected to an ignition line (3) and an ignition device (2) connected to the ignition line (3) to program the electronic igniters (4). The voltage sensor (10) can be connected separately to the ignition line and contains a voltage measuring device (15) for measuring the voltage (U2) on the ignition line (3) at the voltage sensor (10). The voltage sensor (10) also contains a communications device (15, 17, 18, 19) for receiving a start signal from the ignition device (2) triggering the start of the voltage measurement and for transmitting to the ignition device (2) a measured value determined during the voltage measurement.

10 Claims, 2 Drawing Sheets

SENSOR FOR MONITORING ELECTRONIC DETONATION CIRCUITS

BACKGROUND OF THE INVENTION

1. Field of the Invention

The invention relates to a voltage sensor for monitoring electronic ignition circuits, in particular to a voltage sensor which can be connected separately to the ignition line and communicates via the same.

2. Description of the Related Art

Electronic ignition circuits consist of several electronic igniters connected to a generally bi-polar ignition line in turn connected to an ignition device or programming device. The igniters are initiated by a voltage or pulse sequence supplied by the ignition device in the ignition line. A capacitor located in the igniter is charged and the delay time programmed in. Once initiation has finished the igniter draws its operating energy from the capacitor. Therefore, the capacitor voltage during initiation has to be set such that there is sufficient energy available during the course of the programmed delay time, in other words at the ignition point, for the ignition means of the igniter to ignite reliably.

However, in electronic ignition systems wired in parallel the power consumption of the igniter, like parasitic leakage currents, leads to voltage drops on the ignition lines owing to insulation damage or incorrect wiring. There is therefore no guarantee that igniters located further away from the ignition device will receive a programming signal whose voltage is high enough to charge completely the capacitor. However, this is imperative for orderly operation.

The possibility of measuring the ignition circuit electrically before starting programming is known. However, this method is very complex and time intensive.

Also in existence are igniters with integrated voltage sensors for measuring the voltage on the ignition line at each individual igniter. However, this has the critical drawback that the construction of each individual igniter is complicated and this increases the costs and susceptibility to faults. In addition, the power consumption increases and thus also the voltage drop on the ignition line.

SUMMARY OF THE INVENTION

The object of the invention is to make it possible to check in a simple manner whether the voltage at the igniter is sufficient in an electronic ignition circuit to trigger reliably the igniter after the programmed delay time has expired.

This object is achieved according to the invention by using a voltage sensor for monitoring electronic ignitions circuits, where the ignition circuit contains an ignition device, an ignition line and an igniter.

To achieve this object the invention proposes a voltage sensor which can be connected separately to the ignition line and comprises a voltage measuring device for measuring the voltage on the ignition line at the voltage sensor and a communications device for receiving a start signal transmitted by the ignition device, on receipt of which the voltage sensor begins the voltage measurement, and for sending a measured value determined during the voltage measurement to the ignition device.

Accordingly, it is possible in a simple manner to measure the voltage on the ignition line with the voltage sensor according to the invention and further-more to ensure that the voltage at the igniter is sufficient to program reliably and trigger the igniter.

The voltage sensor according to the invention and the ignition device preferably communicate with one another in the form of a signal, with which the ignition device also communicates with the igniters. This can take place, for example by alternating the polarity on the ignition line.

In an advantageous embodiment of the invention the energy required to operate the voltage sensor is obtained from the signals received by the ignition. A capacitor can also be provided as energy store in the voltage sensor. The voltage sensor according to the invention is therefore passive, it does not have its own energy source. As a result it is maintenance-free and storable over a long period. The power consumption is low to avoid additional voltage drops on the ignition line and for practical purposes is less than one milliampere.

The voltage sensor can generally be connected at any point of the ignition line, but for practical purposes is connected to the end of the ignition line in order to be able to determine the maximum voltage drop over the complete length of the ignition line.

The voltage sensor preferably contains a microprocessor with integrated AD converter for measuring the voltage. This simplifies the construction and considerably reduces the power consumption of the voltage sensor. The microprocessor can have a sleep mode which can be activated by software in that the microprocessor switched off almost completely and, for example, merely monitors an activation input. If a start signal is transmitted by the ignition device the sleep mode is terminated and the microprocessor is ready for operation. After a certain interval in which the microprocessor has not been active, it can automatically return to the sleep mode. This can also occur by means of a corresponding signal from the ignition device.

To achieve the object the invention also proposes providing an electronic ignition circuit with several electronic igniters connected to an ignition line, an ignition device connected to the ignition line for programming the igniters and a voltage sensor connected to the ignition line, as has been described above.

An embodiment of the invention will be described in more detail hereinafter with reference to the drawings, in which:

BRIEF DESCRIPTION OF THE DRAWING FIGURES

DETAILED DESCRIPTION

Figure 1:
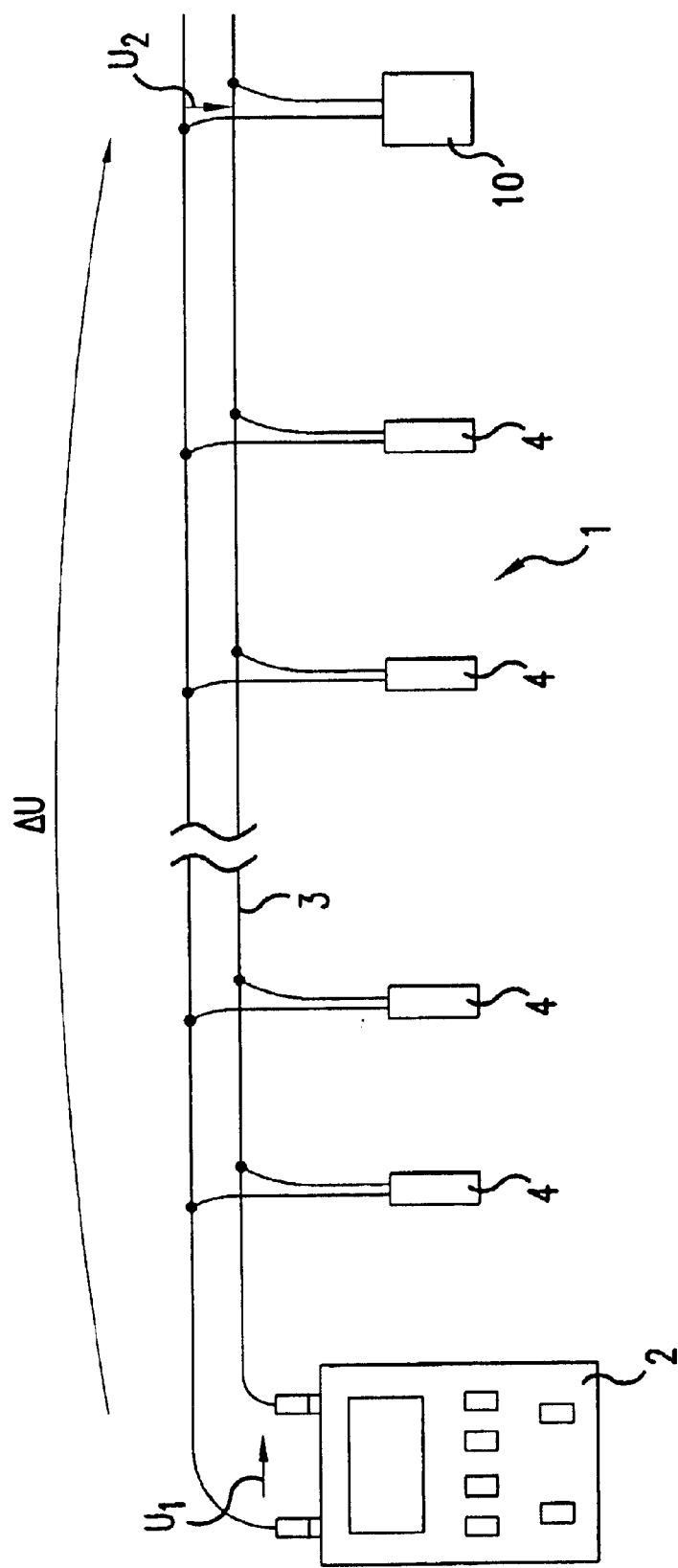
FIG. 1 is a schematic construction of an ignition circuit.

The electronic ignition circuit 1 contains an ignition device 2, to the outputs of which a two-wire ignition line 3 is connected. Several electronic igniters 4 are connected in parallel to the ignition line 3. Each individual igniter 4 can be separately initiated by the ignition device 2 and programmed to a specific delay time. To this end the ignition device 2 transmits coded signals to the ignition line 3, the signals conventionally comprising an address part containing the address of the igniter 4 to be programmed.

A voltage sensor 10 is connected to the ignition line 3 at the end thereof, i.e. at the end of the ignition line 3 remote from the ignition device 2. The voltage sensor 10 measures the voltage U2 on the ignition line 3. The voltage drop $\Delta U$ over the ignition line 3 may be determined using this measured voltage U2 and the known voltage U1 at the ignition device 2.

Figure 2:
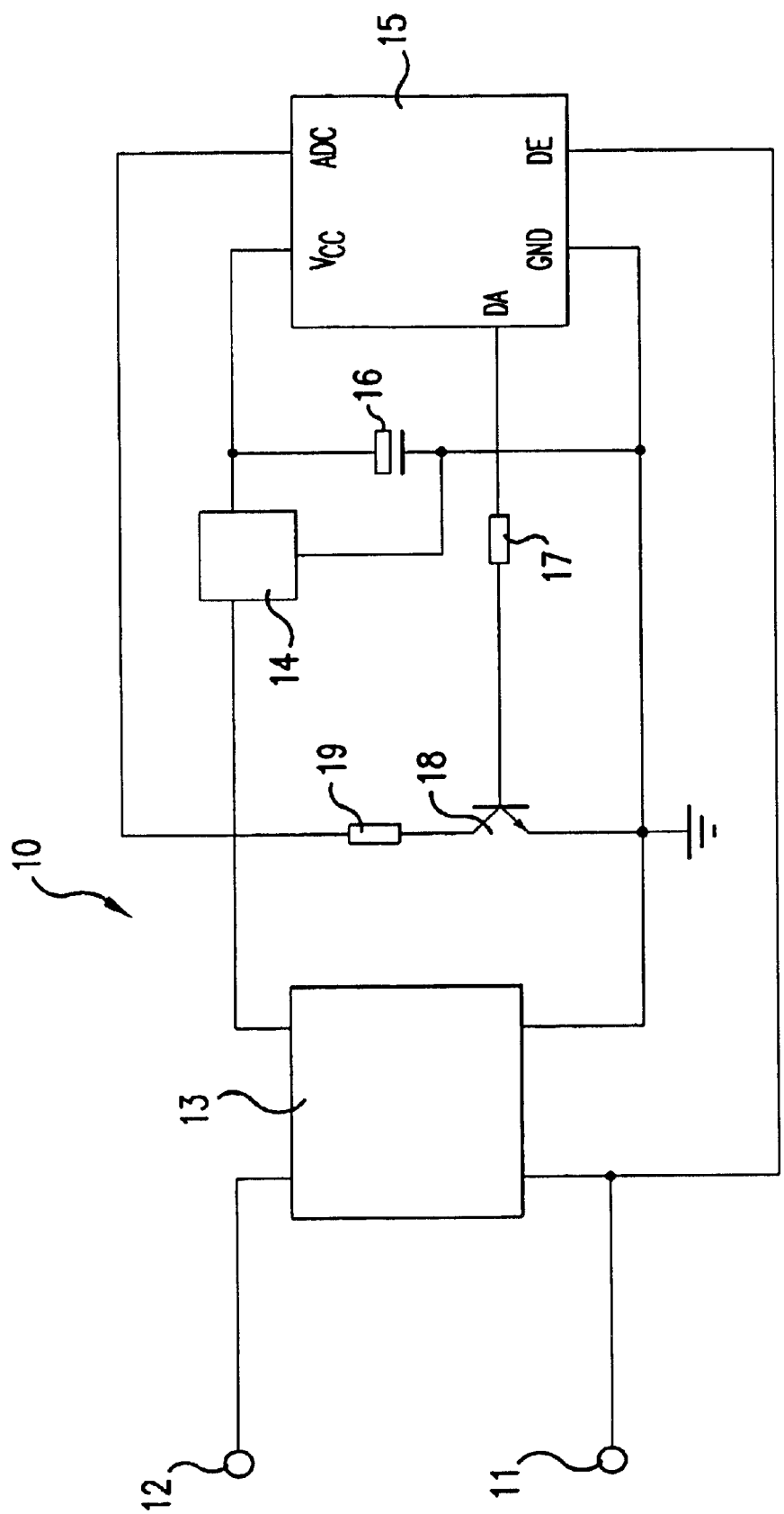
FIG. 2 is a basic circuit diagram of the voltage sensors.

The mode of operation and the construction of the voltage sensor 10 will be described in more detail hereinafter with reference to FIG. 2. The voltage sensor 10 is connected to the ignition line 3 by two terminals 11 and 12. An input suppressor circuit 13 containing a rectifier protects the subsequent circuit against overvoltages and electromagnetic influences. The input suppressor circuit 13 makes the polarity-independent voltage on the ignition line 3 available at its output in a rectified form. This direct voltage is regulated by a voltage regulator 14 to the supply voltage of a microprocessor 15. A capacitor 16 buffers the supply voltage. The capacitor 16 is connected between the terminals VCC and GND of the microprocessor 15.

The microprocessor 15 contains an analogue-to-digital converter which can be addressed via the terminal ADC of the microprocessor 15. The terminal ADC is connected to the output of the input suppressor circuit 13 so that the rectified voltage on the ignition line 3 can be measured. The microprocessor 15 communicates via the terminals DE and DA as does the voltage sensor 10 therefore with the ignition device 2. The terminal DE is the data input of the microprocessor 15 and is connected to the terminal 11. The terminal DA is the data output of the microprocessor 15 and serves to transmit data to the ignition device 2. The base of a transistor 18 is connected to the terminal DA via a resistor 17. If the microprocessor 15 transmits data to the ignition device 2, the transistor 18 is brought into the conductive state so that a current flows through the resistor 19 and this leads to a change in the power consumption of the voltage sensor 10. This change in the power consumption is evaluated by the ignition device 2. Thus data can be coded by means of the change in the power consumption and transmitted to the ignition device 2.

During operation, the voltage sensor 10 operates as follows: after the ignition line 3 including the igniter 4 and the voltage sensor 10, has been laid the ignition device 2 is connected to the ignition line 3. A start signal is now transmitted to the voltage sensor 10 which then measures the voltage at the end of the ignition line 3. Once the measurement has been made, a measured value is coded by the microprocessor 15 and the individual signal parts, for example bits, are emitted in succession via the terminal DA. The change in the power consumption of the voltage sensor 10 caused by the resistors 17 and 19 and the transistor 18 is detected by the ignition device 2 and the bit sequence transmitted in this way is received by the ignition device 2 and decoded into a measured voltage value U2. The measured voltage U2 is subtracted from the initial voltage U1 set at the ignition device 2, from which the voltage drop ΔU over the entire length of the ignition line 3 is derived. The maximum achievable delay time can now be determined with knowledge of the number and the power consumption of the igniters 4. In addition, the voltage U2 indicates the minimum voltage required for ignition. Normal programming of the igniters 4 can now be initiated by the ignition device 2, with care having to be taken that the programming voltage exceeds the required minimum voltage and the delay time of the individual igniters 4 does not exceed the maximum delay time.

With the voltage sensor 10 according to the invention placed at the end of the ignition line, it is possible to monitor on command the voltage U2 at the end of the ignition line 3 irrespective of the line length. The ignition safety can thus be monitored with knowledge of the minimum voltage required for ignition.

What is claimed is:

1. A voltage sensor for monitoring an electronic ignition circuit (1), the ignition circuit (1) comprising a programming device (2), an ignition line (3) and a plurality of igniters (4), it being possible for the voltage sensor (10) to be connected separably to the ignition line (3), wherein the voltage sensor has a voltage measuring device (13, 15) for measuring the voltage (U2) on the ignition line (3) at the voltage sensor (10) and a communications device (15, 17, 18, 19) for receiving a start signal from the programming device (2) for triggering the start of the voltage measurement and for transmitting a measured value to the programming device (2) determined during the voltage measurement.

2. The voltage sensor according to claim 1, wherein the communications device (15, 17, 18, 19) processes and generates types of signals used by the programming device (2) to program the igniter (4).

3. The voltage sensor according to claim 1, wherein an activation device (15, DE) which activates the voltage sensor (10) as a reaction to the start signal.

4. The voltage sensor according to claim 1, wherein the voltage sensor (10) can be connected to the end of the ignition line (3).

5. The voltage sensor according to claim 1, wherein the communications device (15, 17, 18, 19) contains means for changing the power consumption (17, 18, 19) of the voltage sensor (10), the measured values for transmission to the programming device (2) being coded by means of the changed power consumption.

6. An electronic ignition circuit (1) comprising a plurality of electronic igniters (4) connected to an ignition line (3), a programming device (2) connected to the ignition line (3) to program the igniter (4) and a voltage sensor (10) according to claim 1 which can be connected to the ignition line (3).

7. The voltage sensor according to claim 1, wherein the energy required to operate the voltage sensor (10) is obtained from the signals received from the programming device (2).

8. The voltage sensor according to claim 7, wherein a capacitor (16) is provided as energy store.

9. The voltage sensor according to claim 1, wherein the voltage measuring device (15) comprises a microprocessor with integrated AD converter for voltage measurement.

10. The voltage sensor according to claim 9, wherein the microprocessor (15) has a sleep mode which can be activated by software and can be terminated by the start signal.

* * * * *